(12) United States Patent
Amemiya

(10) Patent No.: US 9,671,452 B2
(45) Date of Patent: Jun. 6, 2017

(54) SUBSTRATE INSPECTION APPARATUS AND PROBE CARD TRANSFERRING METHOD

(71) Applicant: Tokyo Electron Limited, Tokyo (JP)

(72) Inventor: Takashi Amemiya, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 87 days.

(21) Appl. No.: 14/591,148

(22) Filed: Jan. 7, 2015

(65) Prior Publication Data

US 2015/0192607 A1 Jul. 9, 2015

(30) Foreign Application Priority Data

Jan. 8, 2014 (JP) ................................. 2014-001651

(51) Int. Cl.
*G01R 31/00* (2006.01)
*G01R 31/26* (2014.01)
*G01R 31/28* (2006.01)
*G01R 31/27* (2006.01)

(52) U.S. Cl.
CPC ..... *G01R 31/2601* (2013.01); *G01R 31/2893* (2013.01); *G01R 31/27* (2013.01)

(58) Field of Classification Search
CPC . G01R 31/2601; G01R 31/2893; G01R 31/27
USPC .......................... 324/756.07, 756.03, 750.02
See application file for complete search history.

(56) References Cited

U.S. PATENT DOCUMENTS

| 2012/0126844 | A1* | 5/2012 | Yasuta | G01R 31/2893 324/756.07 |
| 2013/0241588 | A1* | 9/2013 | Yamada | G01R 31/2601 324/750.24 |

FOREIGN PATENT DOCUMENTS

JP 2002-022768 A 1/2002

* cited by examiner

*Primary Examiner* — Farhana Hoque
(74) *Attorney, Agent, or Firm* — Pearne & Gordon LLP

(57) ABSTRACT

A wafer inspection apparatus 10 includes a middle plate 22 that mounts a probe card 18 in which multiple contact probes 20 are provided; a drawer type table 21 in which the middle plate 22 is provided; a tester 15 to which the probe card 18 is mounted; and a transfer robot 17 that transfers the middle plate 22. The middle plate 22 includes a base 23 and multiple supports 24 protruding toward the probe card 18 to be mounted. A protruding height of each support 24 is equal to or higher than a protruding length of the contact probe 20 from the probe card 18. The probe card 18 is fastened to a probe card cover 29 when the probe card 18 is mounted on the middle plate 22, and the transfer robot 17 transfers the middle plate 22 from the table 21 to the tester 15.

10 Claims, 11 Drawing Sheets

SUBSTRATE INSPECTION APPARATUS AND PROBE CARD TRANSFERRING METHOD

CROSS-REFERENCE TO RELATED APPLICATION

This application claims the benefit of Japanese Patent Application No. 2014-001651 filed on Jan. 8, 2014, the disclosures of which are incorporated herein by reference.

TECHNICAL FIELD

The embodiments described herein pertain generally to a substrate inspection apparatus which includes multiple testers and transfers a probe card provided in each of the testers, and a probe card transferring method.

BACKGROUND

As an inspection apparatus to inspect a wafer on which multiple semiconductor devices are formed, a prober has been used. The prober includes a probe card provided to face a wafer, and the probe card includes a base member having a plate shape and multiple contact probes as column-shaped contact terminals arranged on a wafer-facing surface of the base member to respectively face electrode pads or solder bumps of the semiconductor devices on the wafer (see, for example, Patent Document 1).

In the prober, the contact probes of the probe card are in contact with the electrode pads or the solder bumps of the semiconductor devices, respectively, and by applying an electric current to an electrical circuit of each semiconductor device in which the electrode pad or the solder bump is connected with each contact probe, electrical characteristics such as a conducting state of the electrical circuit are inspected.

Further, in order to improve wafer inspection efficiency, there has been developed a wafer inspection apparatus in which multiple probe cards are provided in an inspection chamber and while a wafer is transferred to a probe card by a transfer stage, semiconductor devices on the wafer can be inspected by another probe card. In this wafer inspection apparatus, multiple testers as wafer inspection interfaces are provided to face the wafer in the inspection chamber and a probe card is provided to each tester.

In the above-described wafer inspection apparatus, the probe cards need to be replaced due to abrasion of contact probes. When the probe card is replaced, a transfer robot collects the probe cards from the tester, and then, transfers a new probe card or a probe card, on which a maintenance process is completed, to the tester.

Patent Document 1: Japanese Patent Laid-open Publication No. 2002-022768

However, the probe card used in the above-described wafer inspection apparatus has a simple configuration in consideration of transfer within the wafer inspection apparatus. Therefore, there is a small portion that can be held by an operator, which makes it difficult for the operator to handle the probe cards. In particular, there has been recently developed a probe card that inspects multiple semiconductor devices formed on a wafer at the same time. However, since multiple contact probes are formed on such a probe card, there is almost no portion that can be held by an operator. Thus, when the operator loads the probe card into a wafer inspection apparatus, the operator may accidently contact the contact probe and bend the contact probe or may damage the contact probe in the worst case.

SUMMARY

In view of the foregoing, example embodiments provide a substrate inspection apparatus into which a probe card can be introduced without bending a contact probe, and a probe card transferring method.

In one example embodiment, a substrate inspection apparatus includes a transfer mounting table configured to mount a probe card where multiple contact probes (cylindrical contact terminals) are provided on at least one surface thereof; at least one (drawer type) table in which the transfer mounting table is provided; a tester to which the probe card is mounted; and a transfer device configured to transfer the transfer mounting table. The transfer mounting table includes a base member and a supporting member protruding from the base member toward the probe card to be mounted. Further, a protruding height of the supporting member is equal to or higher than a protruding length of the contact probe from the probe card, and the probe card is fastened to a holding device when the probe card is mounted on the transfer mounting table. Furthermore, the transfer device transfers the transfer mounting table that mounts the probe card thereon from the at least one table to the tester.

The transfer device may include an arm configured to enter into a space between the at least one table and the transfer mounting table, and the arm may separate the transfer mounting table that mounts the probe card thereon from the at least one table. When the transfer mounting table is transferred from the at least one table to the tester, the arm may be contracted to deliver the transfer mounting table to the transfer device.

When the transfer mounting table is transferred from the at least one table to the tester, the transfer mounting table may be held on the arm.

The transfer mounting table may further include a pin protruding from the base member toward the probe card to be mounted, and the pin may be configured to regulate a position of the probe card.

The at least one table may be plural in number.

The substrate inspection apparatus may further include an accommodation unit that is disposed at a position where the transfer device reaches when the transfer mounting table is transferred from the at least one table to the tester, and configured to accommodate the probe card.

In another example embodiment, there is provided a probe card transferring method performed in a substrate inspection apparatus including a transfer mounting table that mounts a probe card where multiple contact probes (cylindrical contact terminals) are provided on at least one surface thereof; a (drawer type) table in which the transfer mounting table is provided; a tester to which the probe card is mounted; and a transfer device configured to transfer the transfer mounting table. Here, the transfer mounting table includes a base member and a supporting member protruding from the base member toward the probe card to be mounted, and a protruding height of the supporting member is equal to or higher than a protruding length of the contact probe from the probe card. In the probe card transferring method, the probe card is fastened to a holding device when the probe card is mounted on the transfer mounting table, and the transfer device transfers the transfer mounting table that mounts the probe card thereon from the table to the tester.

The transfer device may include an arm configured to enter into a space between the table and the transfer mounting table, and the arm separates the transfer mounting table that mounts the probe card thereon from the table. When the transfer mounting table is transferred from the table to the tester, the arm may be contracted to deliver the transfer mounting table to the transfer device.

When the transfer mounting table is transferred from the table to the tester, the transfer mounting table may be held on the arm.

The transfer mounting table may further include a pin protruding from the base member toward the probe card to be mounted, and the pin may be configured to regulate a position of the probe card.

In accordance with the example embodiments, when the probe card is mounted on the transfer mounting table, the probe card is fastened to the holding device. Thus, if an operator loads the probe card into the substrate inspection apparatus, the operator can hold the holding device and does not need to hold the probe card. Further, the protruding height of the supporting member from the base member of the transfer mounting table is equal to or higher than a protruding length of the contact probe from the probe card. Thus, the contact probe of the mounted probe card is not in contact with the base member of the transfer mounting table. Therefore, it is possible to load the probe card into the substrate inspection apparatus without bending the contact probe.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 3A is a plane view, FIG. 3B is a side view, and FIG. 3C is a bottom view;

FIG. 6A is a plane view and FIG. 6B is a side view;

FIG. 7A is a plane view and FIG. 7B is a cross-sectional view taken along a line VII-VII in FIG. 7A;

DETAILED DESCRIPTION

Figure 1:
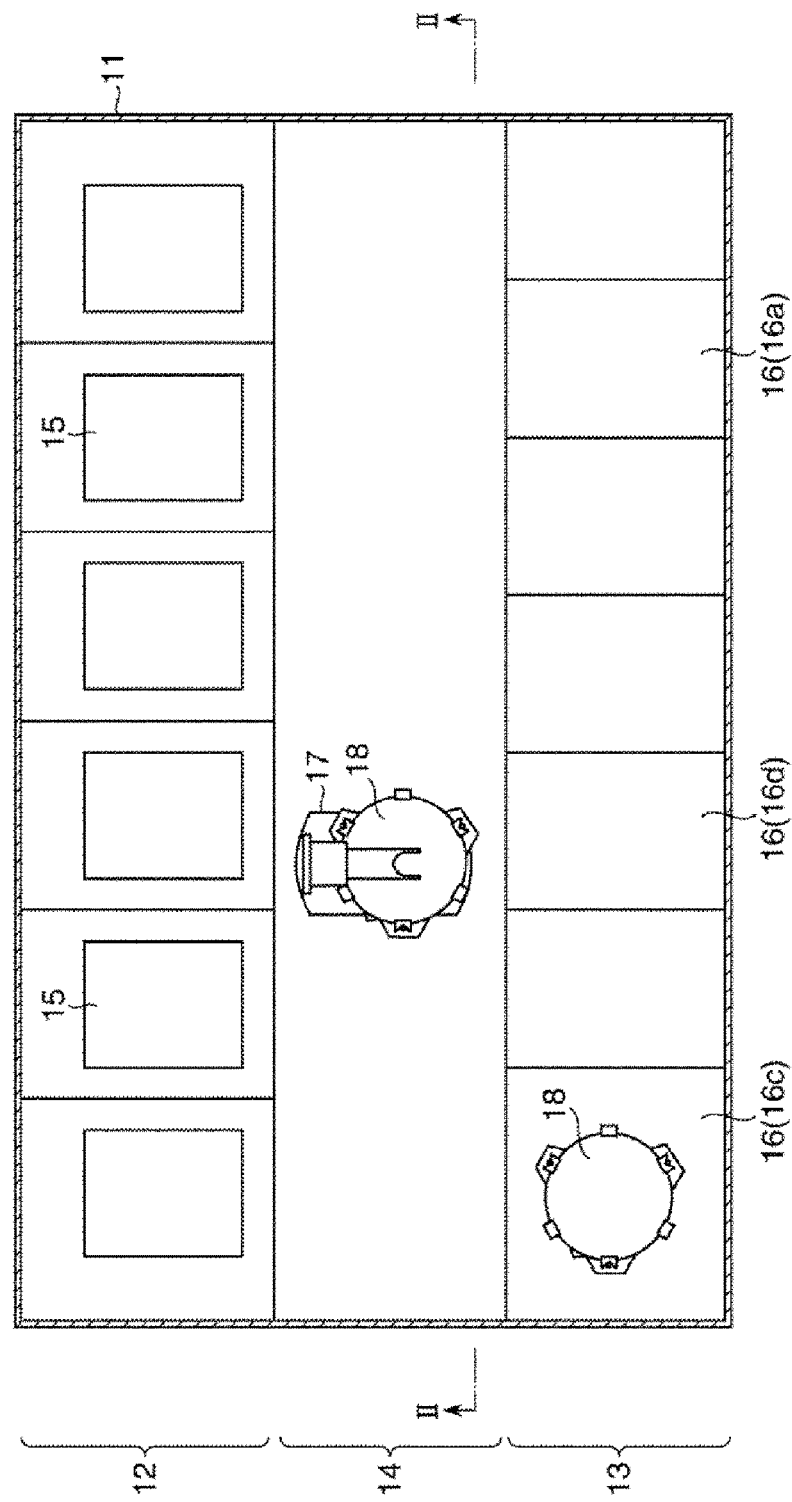
FIG. 1 is a horizontal cross-sectional view schematically illustrating a configuration of a wafer inspection apparatus to which a probe card transferring method in accordance with an example embodiment is applied.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Firstly, there will be explained a wafer inspection apparatus as a substrate inspection apparatus to which a probe card transferring method is applied in accordance with the present example embodiment.

Figure 2:
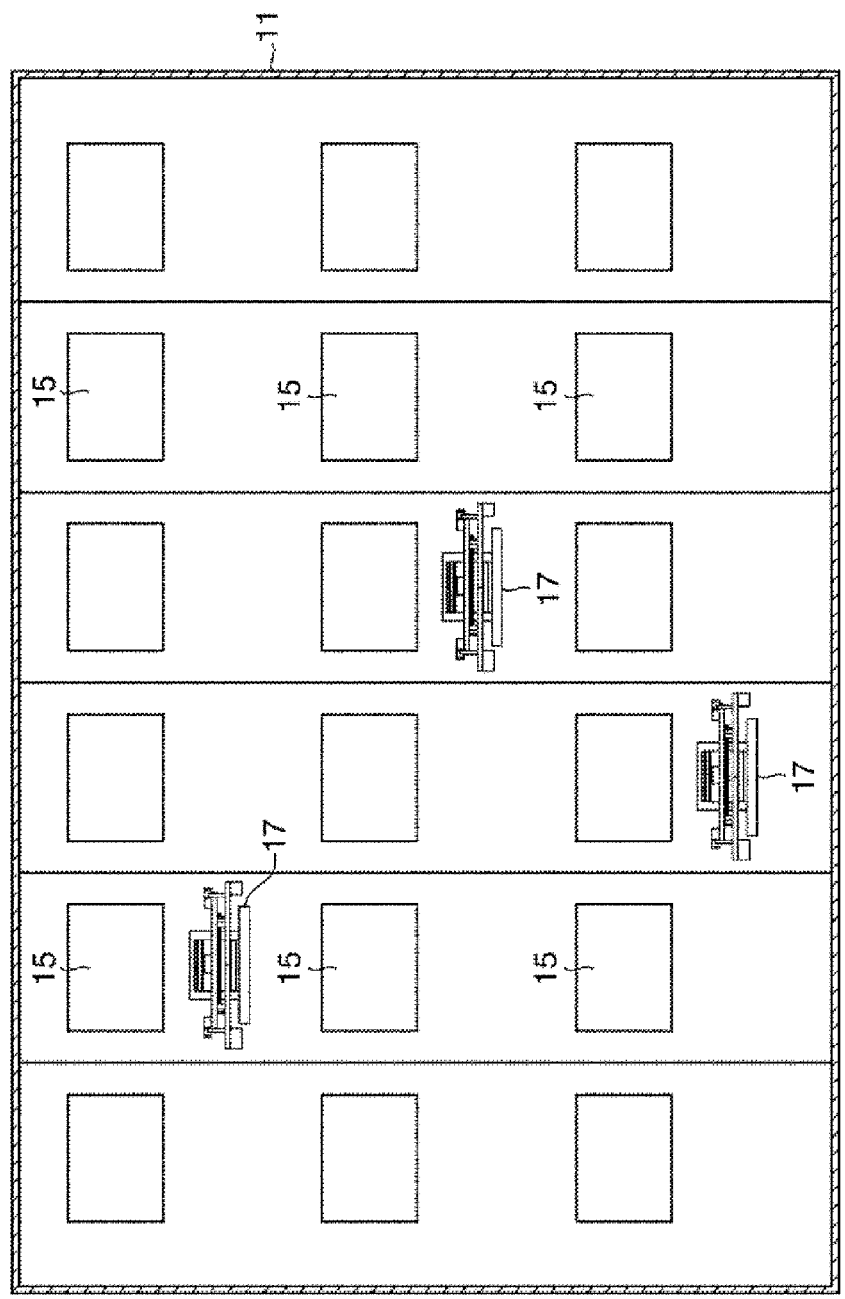
FIG. 2 is a cross-sectional view taken along a line II-II in FIG. 1.

FIG. 1 is a horizontal cross-sectional view schematically illustrating a configuration of the wafer inspection apparatus to which the probe card transferring method in accordance with the present example embodiment is applied, and FIG. 2 is a cross-sectional view taken along a line II-II in FIG. 1.

In FIG. 1 and FIG. 2, a wafer inspection apparatus 10 includes an inspection chamber 11, and the inspection chamber 11 includes an inspection section 12 where electrical characteristics of semiconductor devices on a wafer are inspected; a loading/unloading section 13 where the wafer or a probe card 18 to be described later is loaded and unloaded with respect to the inspection chamber 11; and a transfer section 14 provided between the inspection section 12 and the loading/unloading section 13.

In the inspection section 12, multiple testers 15 as wafer inspection interfaces are arranged. The multiple testers 15 constitute a tester row including multiple testers arranged horizontally, and a probe card 18 is provided under each tester 15.

The loading/unloading region 13 is divided into multiple accommodation spaces 16, and the accommodation spaces 16 include a port 16a configured to receive a container, for example, a FOUP, that accommodates multiple wafers; a loader 16c where the probe card 18 is loaded or unloaded;

and a controller 16*d* configured to control operations of components of the wafer inspection apparatus 10, respectively.

In the transfer section 14, a movable transfer robot 17 (transfer device) is provided. The transfer robot 17 receives a wafer from the port 16*a* in the loading/unloading region 13 and transfers the wafer to the tester 15, and transfers a wafer, to which an inspection for electrical characteristics of semiconductor devices is completely conducted, from the tester 15 to the port 16*a*. Further, the transfer robot 17 transfers the probe card 18, which is required to be replaced or maintained, from the tester 15 to the loader 16*c* in the loading/unloading region 13, and transfers a new probe card 18 or a probe card 18, on which a maintenance process is completed, from the loader 16*c* to the tester 15.

In the wafer inspection apparatus 10, each tester 15 inspects electrical characteristics of semiconductor devices on the transferred wafer. While the transfer robot 17 transfers a wafer to one of the testers 15, another tester 15 can inspect electrical characteristics of semiconductor devices on another wafer. Thus, it is possible to improve wafer inspection efficiency.

Figure 3A:
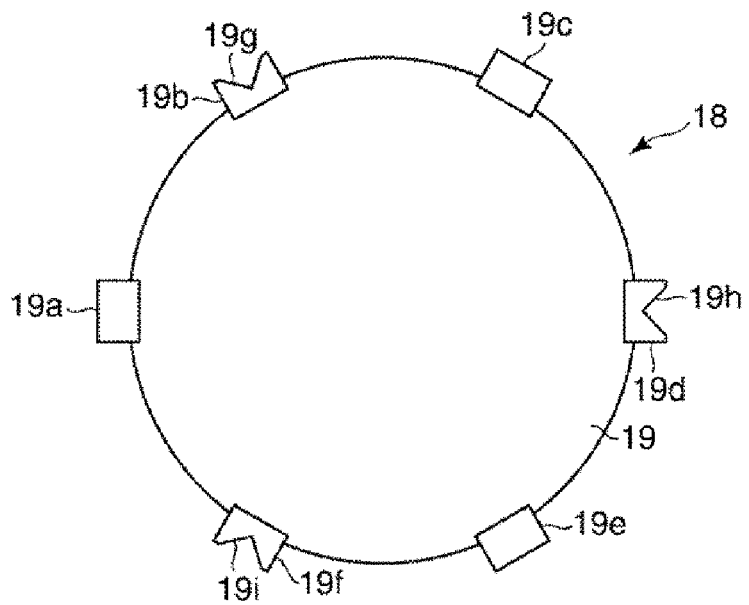
FIG. 3A to FIG. 3C schematically illustrate a configuration of a probe card, and to be specific.
Figure 3B:
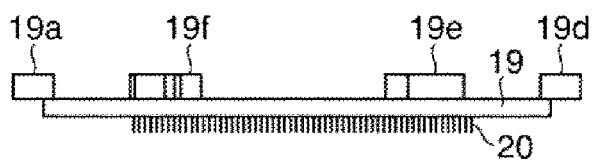
Figure 3C:
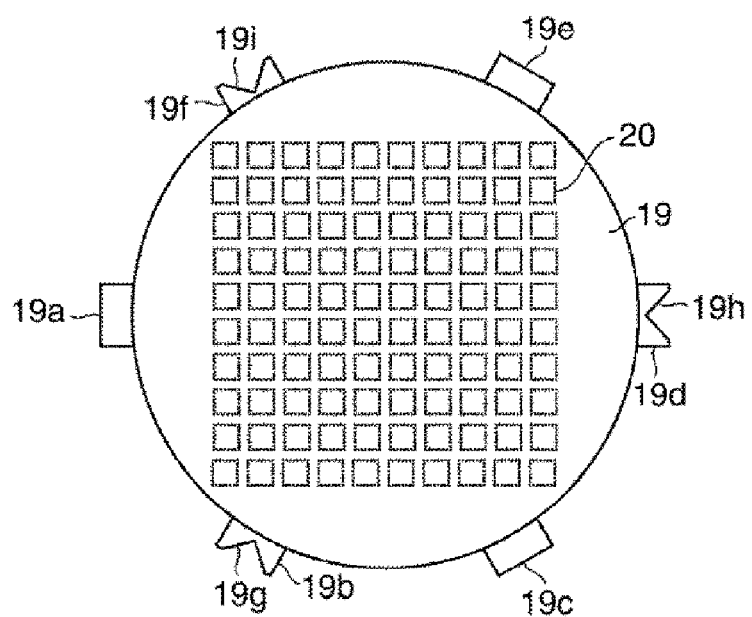

FIG. 3A to FIG. 3C schematically illustrate a configuration of a probe card, and to be specific, FIG. 3A is a plane view, FIG. 3B is a side view, and FIG. 3C is a bottom view.

In FIG. 3A to FIG. 3C, the probe card 18 includes a main body 19 having a circular or polygonal plate shape (for example, hexadecagonal shape); engagement plates 19*a* to 19*f* each having an approximately rectangular shape; multiple electrodes (not illustrated) arranged on an approximately one surface of the upper surface of the main body 19; and multiple contact probes 20 arranged to downwardly protrude from a lower surface of the main body 19 in a lattice shape. Here, the engagement plates 19*a* to 19*f* are arranged at regular intervals, for example, 60° intervals, along the periphery of the upper surface of the main body 19 and are protruded toward the outside thereof.

Each electrode is connected with a corresponding contact probe 20 thereof, and when a wafer arrives at the probe card 18, each contact probe 20 is brought into contact with the electrode pad or the solder bump of each semiconductor device formed on the wafer. Further, among the engagement plates 19*a* to 19*f*, the engagement plates 19*b*, 19*d*, and 19*f* arranged at 120° intervals have outwardly opened notches 19*g* to 19*i*, respectively, formed into triangular shapes in a plane view.

In the wafer inspection apparatus 10, there are provided tables 21 configured to allow the probe card 18, which is required to be maintained, to be easily unloaded or allow a new probe card 18 or the probe card 18, on which a maintenance process is completed, to be easily loaded, as described below.

Figure 4:
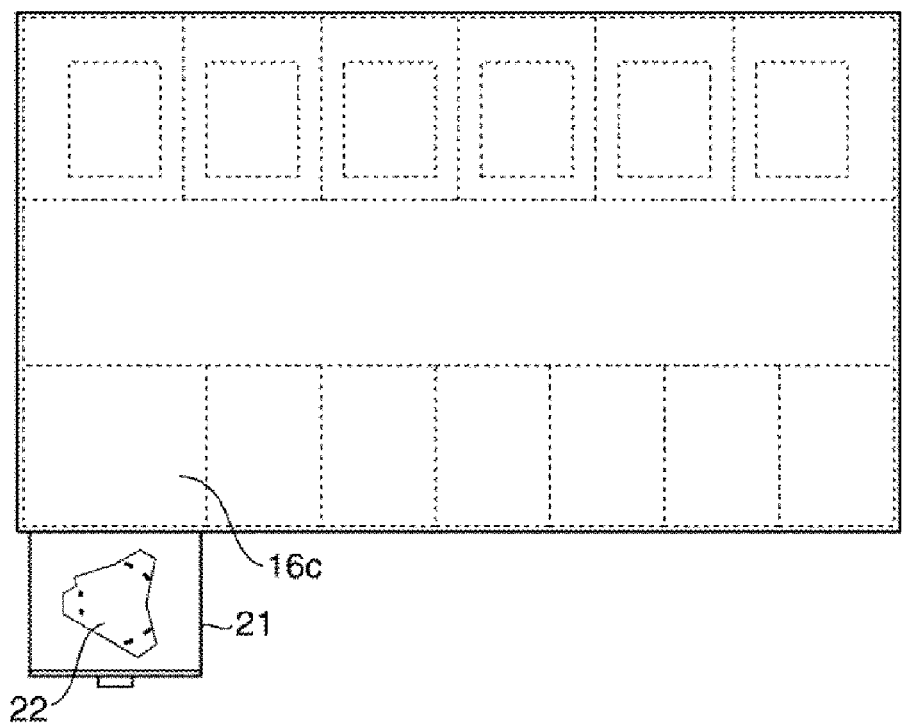
FIG. 4 is a plane view provided to explain an arrangement of tables of the wafer inspection apparatus illustrated in FIG. 1 and FIG. 2.
Figure 5:
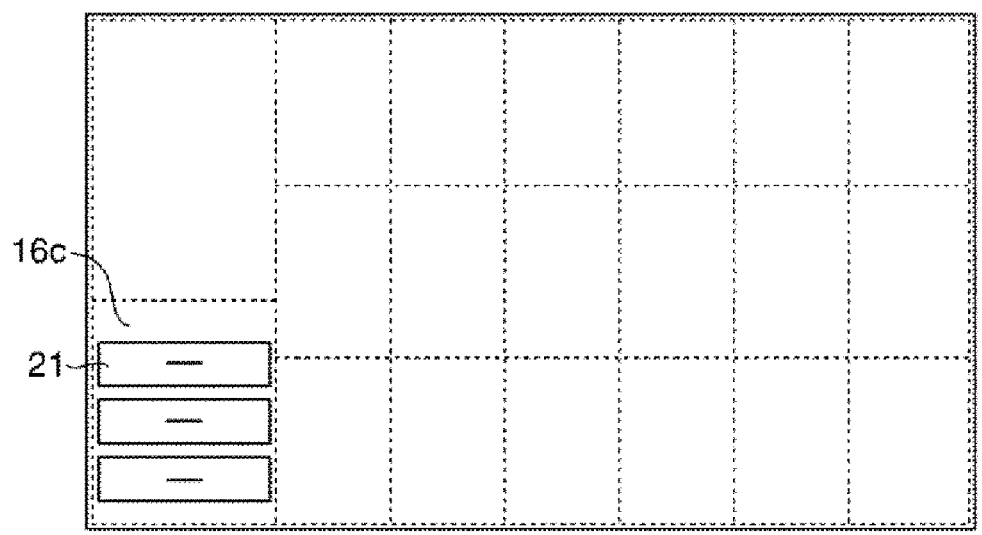
FIG. 5 is a front view provided to explain the arrangement of tables of the wafer inspection apparatus illustrated in FIG. 1 and FIG. 2.

FIG. 4 is a plane view provided to explain an arrangement of tables of the wafer inspection apparatus illustrated in FIG. 1 and FIG. 2, and FIG. 5 is a front view thereof.

In FIG. 4 and FIG. 5, the loader 16*c* of the wafer inspection apparatus 10 includes multiple, for example, three plate-shaped tables 21 arranged to be stacked with each other. Each table 21 is configured to be unloaded from a side of the wafer inspection apparatus 10, and on an upper surface thereof, a middle plate 22 (transfer mounting table) is provided. The middle plate 22 is configured to mount the probe card 18 thereon, and a single middle plate 22 is provided on each table 21.

In the present example embodiment, an unloading amount of each table 21 is set to be greater than a diameter of the probe card 18, and when the probe card 18 is mounted on the middle plate 22 of the table 21, the probe card 18 can be mounted just by being downwardly moved from an upper side of the table 21. Therefore, an operator can easily mount the probe card 18 on the middle plate 22.

The operator may mount the probe card 18 on the middle plate 22 of only one table 21, or may mount the probe cards 18 on the middle plates 22 of the multiple tables 21. In the latter case, if the probe card 18 is transferred from one table 21 by the transfer robot 17, the other tables 21 serve as stockers that temporarily store the probe cards 18.

Figure 6A:
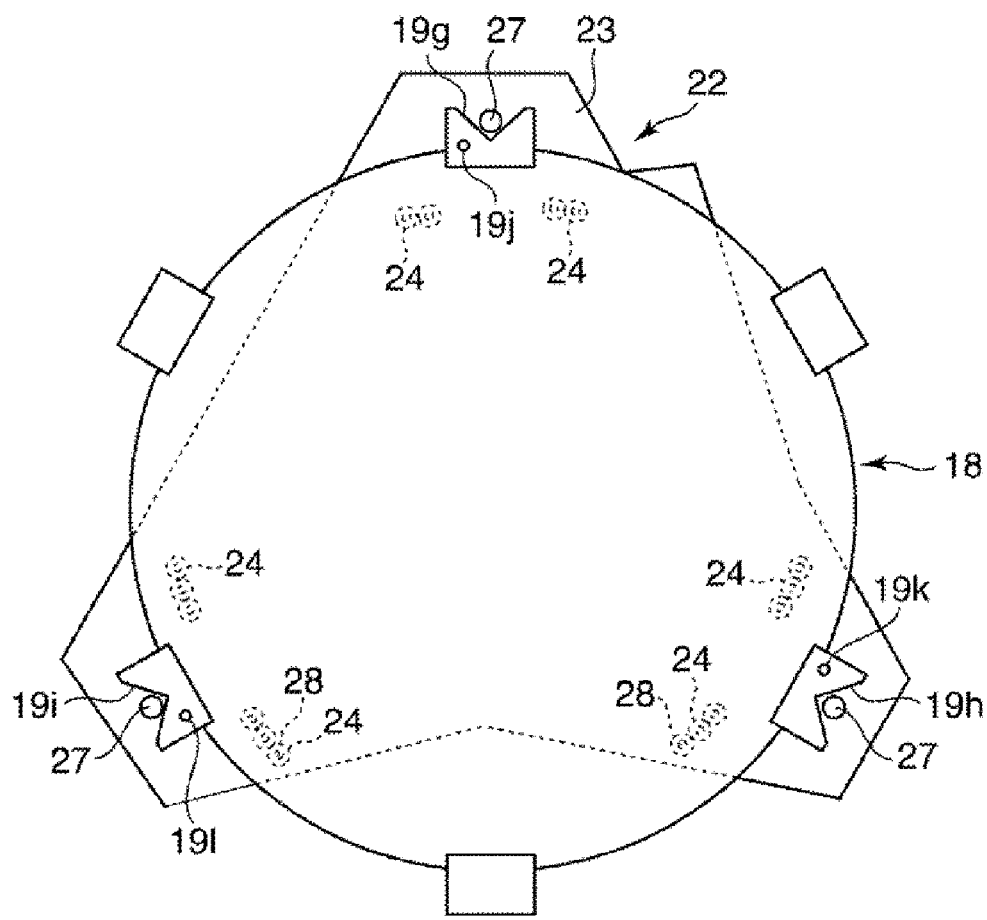
FIG. 6A and FIG. 6B schematically illustrate a configuration of a middle plate, and to be specific.
Figure 6B:
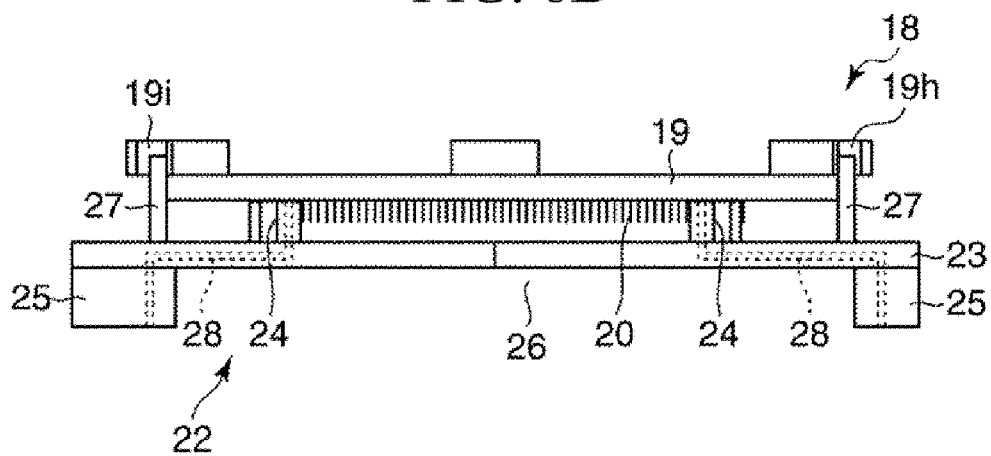

FIG. 6A and FIG. 6B schematically illustrate a configuration of a middle plate, and to be specific, FIG. 6A is a plane view and FIG. 6B is a side view. Further, FIG. 6A and FIG. 6B illustrate that the middle plate 22 mounting the probe card 18 thereon, and particularly in FIG. 6A, a portion of the middle plate 22 covered by the probe card 18 is illustrated by a broken line.

The middle plate 22 includes a base 23 (base member) formed into an approximately triangular plate shape in a plane view; and multiple cylindrical supports 24 (supporting members) protruding from the base 23 toward the probe card 18 to be mounted. A height of each support 24 protruding from the base 23 is equal to or higher than a length of the contact probe 20 protruding from the main body 19 of the probe card 18.

The supports 24 are concentrically arranged to be dense in the vicinity of the vertexes of the base 23 in a plane view. Further, the supports 24 are brought into contact with a portion, on which the contact probes 20 are not arranged, on the lower surface of the main body 19 of the probe card 18, so that the supports 24 can support the probe card 18.

The middle plate 22 has spacers 25 respectively arranged under the vertexes of the base 23. The spacers 25 support the base 23 and form a space 26 between the base 23 and the table 21 when the middle plate 22 is mounted on the table 21.

Further, the middle plate 22 includes upwardly protruding round rod-shaped locating pins 27 arranged on the further outer side than the respective supports 24 and near the respective vertexes of the base 23. When the supports 24 support the probe card 18, the notches 19*g* to 19*i* of the probe card 18 are engaged with the locating pins 27, respectively.

When the notches 19*g* to 19*i* are engaged with the locating pins 27, respectively, the notches 19*g* to 19*i* do not surround the entire side surfaces of the locating pins 27. Therefore, when the probe card 18 is mounted on the middle plate 22, the locating pins 27 are not unnecessarily brought into contact with side surfaces of the notches 19*g* to 19*i*, respectively. Thus, the locating pins 27 do not disturb mounting of the probe card 18 on the middle plate 22.

Further, the middle plate 22 has vacuum lines 28 each opened at a lower surface of the spacer 25, and opened at the vertex of the support 24 while passing through the spacer 25, the base 23 and the support 24. The vacuum lines 28 are provided to correspond to the supports 24, respectively, and a negative pressure can be applied to the vacuum lines 28.

Figure 7A:
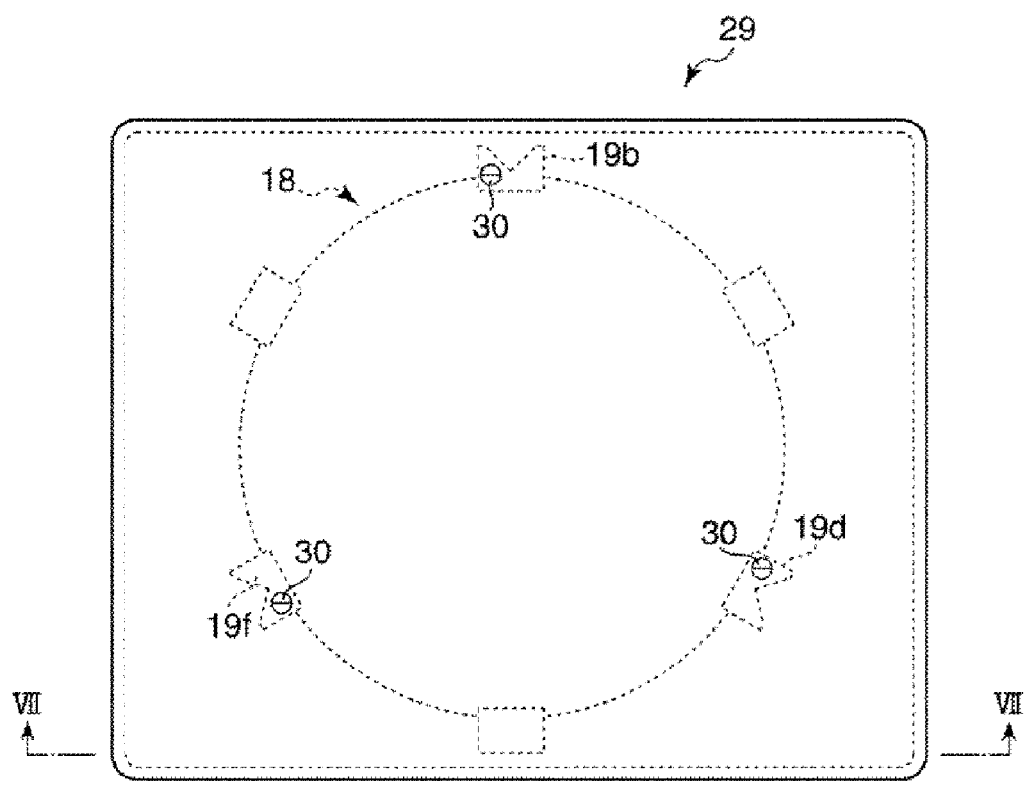
FIG. 7A and FIG. 7B schematically illustrate a configuration of a probe card cover to be used when the probe card is loaded into the wafer inspection apparatus, and to be specific.
Figure 7B:
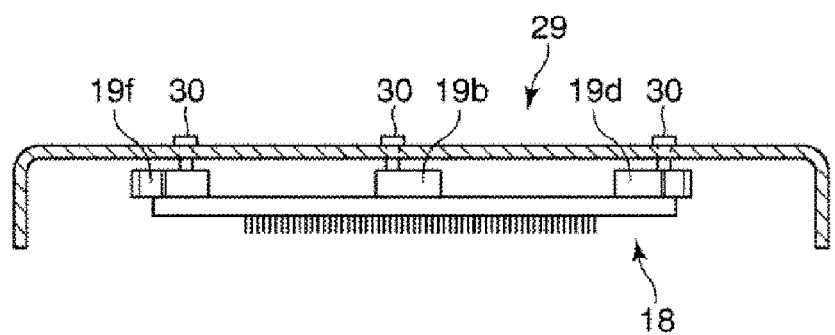

FIG. 7A and FIG. 7B schematically illustrate a configuration of a probe card cover to be used when the probe card is introduced into the wafer inspection apparatus, and to be specific, FIG. 7A is a plane view and FIG. 7B is a cross-sectional view taken along a line VII-VII in FIG. 7A. Further, FIG. 7A and FIG. 7B illustrate that the probe card 18 is being mounted on a probe card cover 29, and particularly in FIG. 7A, the probe card 18 covered by the probe card cover 29 is illustrated by a broken line.

The probe card cover 29 (holding device) is formed of a transparent or translucent cover-shaped member which is larger than the probe card 18 in a plane view, and covers the entire surface of the probe card 18. In the probe card cover 29, engagement members, for example, engagement bolts 30, protruding toward the probe card 18 are provided at portions corresponding to the engagement plates 19b, 19d, and 19f of the probe card 18. The engagement bolts 30 are screw-coupled into bolt holes 19j, 19k, and 19l formed at the engagement plates 19b, 19d, and 19f, respectively (see FIG. 6A), so that the probe card 18 is fastened to the probe card cover 29.

Hereinafter, there will be explained a probe card transferring method in accordance with the present example embodiment.

FIG. 8A to FIG. 10B are process diagrams provided to explain a probe card transferring method performed in the wafer inspection apparatus illustrated in FIG. 1.

Figure 8A:
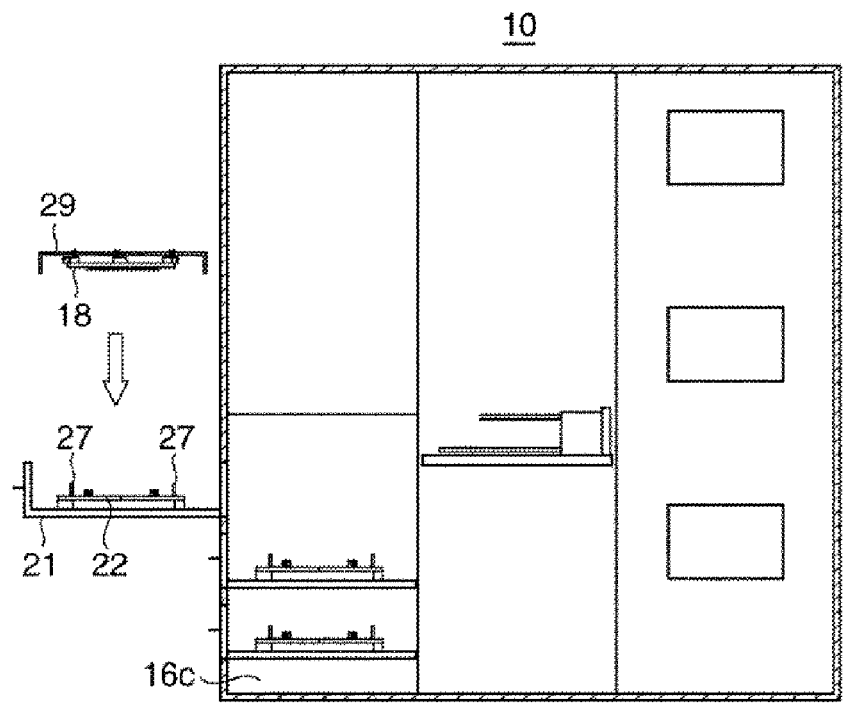
FIG. 8A and FIG. 8B are process diagrams provided to explain a probe card transferring method performed in the wafer inspection apparatus illustrated in FIG. 1.

Firstly, the operator unloads a single table 21 from the loader 16c of the wafer inspection apparatus 10, and mounts the probe card 18, which is fastened to the probe card cover 29, on the middle plate 22 arranged on the unloaded table 21 (FIG. 8A). When the probe card 18 is mounted on the middle plate 22, the locating pins 27 are respectively engaged with the notches 19g to 19i of the probe card 18, so that a relative position of the probe card 18 with respect to the middle plate 22 is determined.

Figure 8B:
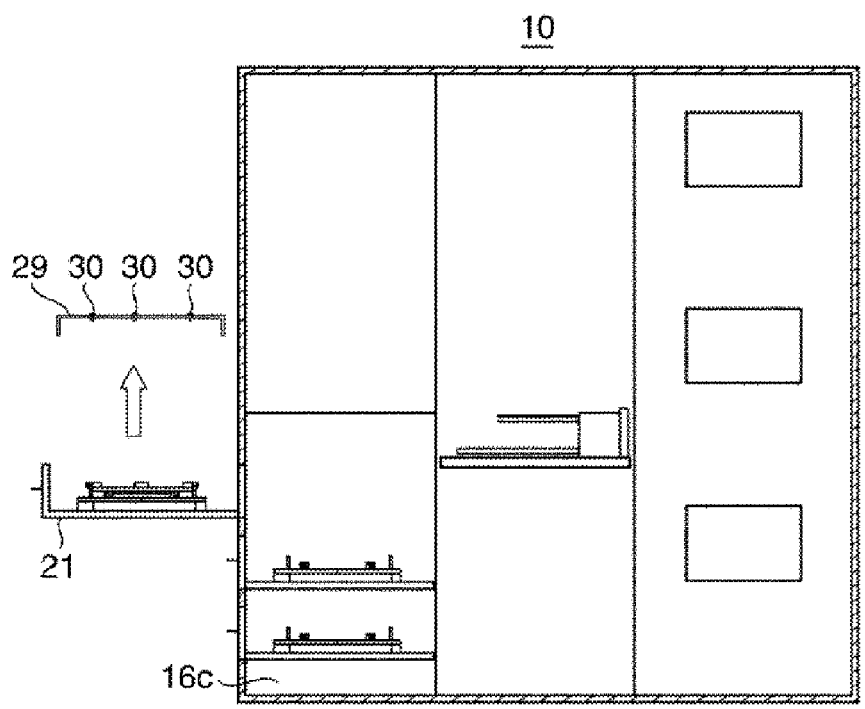

Then, the operator separates the probe card cover 29 from the probe card 18 by loosening the engagement bolts 30, and then, removes the probe card cover 29 from the table 21 (FIG. 8B).

Figure 9A:
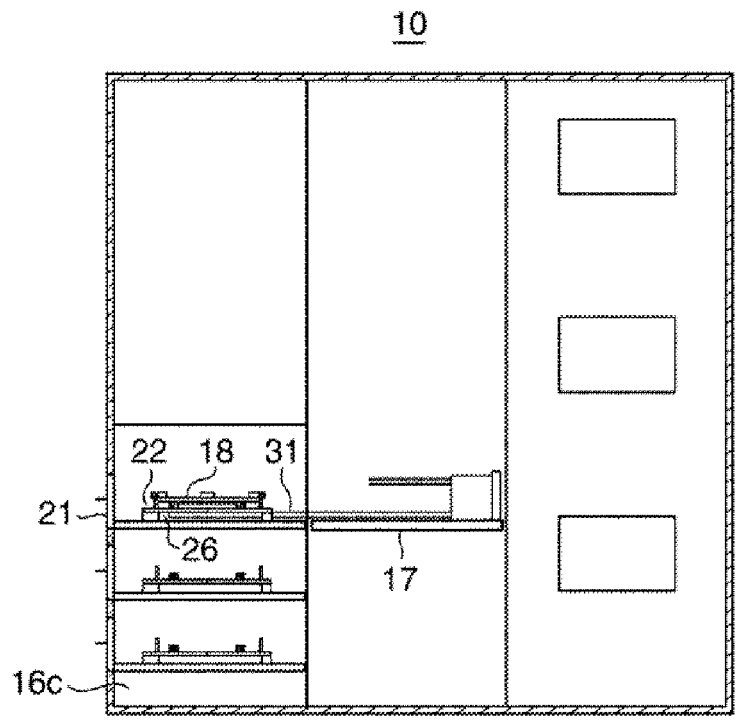
FIG. 9A and FIG. 9B are process diagrams provided to explain the probe card transferring method performed in the wafer inspection apparatus illustrated in FIG. 1.

Then, after the operator pushes the table 21 into the loader 16c to be accommodated therein, the transfer robot 17 is moved to face the middle plate 22 that mounts the probe card 18 thereon and a transfer arm 31 of the transfer robot 17 is extended to enter into the space 26 between the base 23 of the middle plate 22 and the table 21. Thereafter, the transfer robot 17 is slightly moved upwards, and the transfer arm 31 is brought into contact with the base 23, and, thus, the middle plate 22 that mounts the probe card 18 thereon is separated from the table 21 (FIG. 9A). The transfer arm 31 has a suction opening (not illustrated) to which a negative pressure can be applied, and this suction opening sucks the base 23 of the middle plate 22. Thus, the transfer arm 31 can hold the middle plate 22.

Figure 9B:
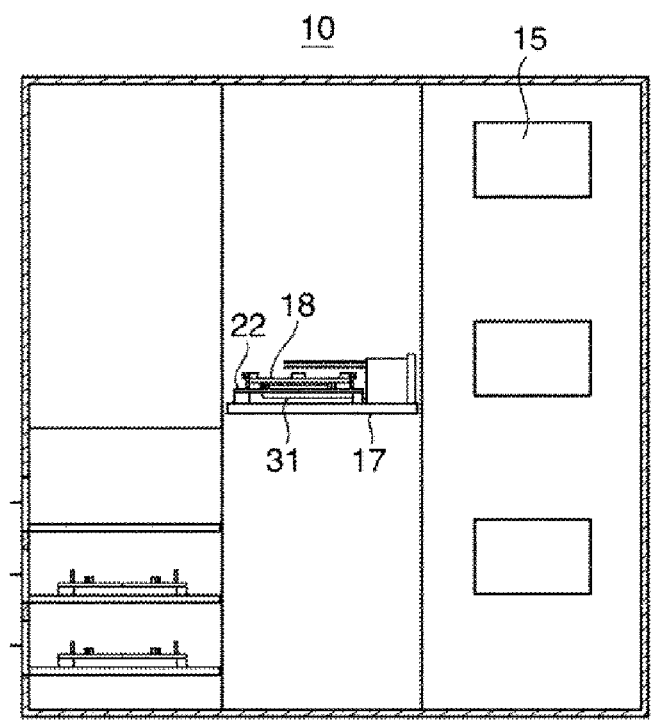
Figure 10A:
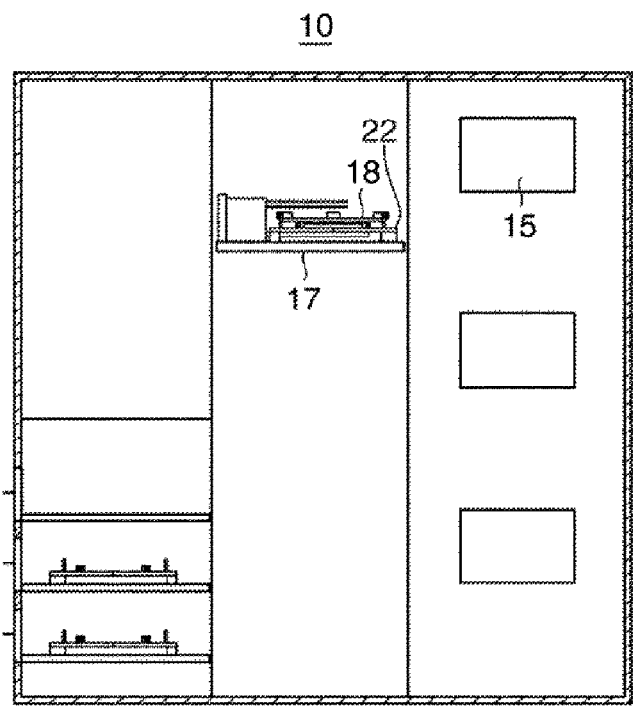
FIG. 10A and FIG. 10B are process diagrams provided to explain the probe card transferring method performed in the wafer inspection apparatus illustrated in FIG. 1.
Figure 10B:
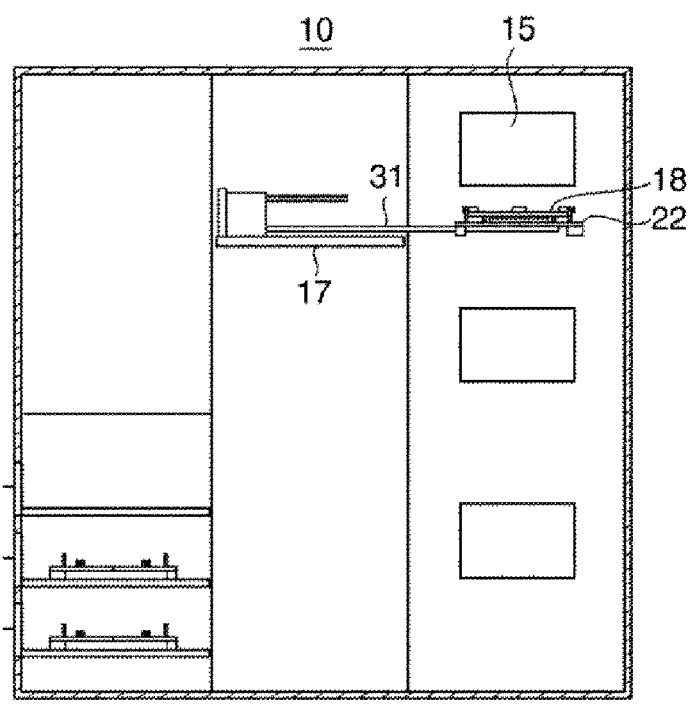

Then, the transfer arm 31 is contracted to deliver the middle plate 22 to the transfer robot 17. After the middle plate 22 is positioned on the transfer robot 17, the transfer robot 17 is moved to a position corresponding to the tester 15 to which the probe card 18 mounted on the middle plate 22 is provided, so that the probe card 18 is transferred (FIG. 9B). While the transfer robot 17 is moved to the position corresponding to the tester 15, the transfer robot 17 is horizontally rotated at 180° to allow the transferred probe card 18 to face a space under the tester 15 (FIG. 10A).

Then, the wafer inspection apparatus 10 checks a position of the probe card 18 or a position of the transfer robot 17 with a camera (not illustrated), and then, another suction opening (not illustrated) of the transfer arm 31 applies a negative pressure to the vacuum line 28, so that the probe card 18 is held on the middle plate 22 and the transfer arm 31. Thereafter, the transfer arm 31 is extended to allow the probe card 18 mounted on the middle plate 22 to face the tester 15. Then, the transfer robot 17 is slightly moved to adjust a position of the probe card 18 with respect to the tester 15 and then moved upwards to mount the probe card 18 on the tester 15 (FIG. 10B), and the present process is ended.

Further, when separating the probe card 18 from the tester 15 and unloading it from the wafer inspection apparatus 10 via the table 21, the above-described processes depicted in FIG. 8A to FIG. 10B are performed in reverse order.

According to the probe card transferring method in accordance with the present example embodiment, when the probe card 18 is mounted on the middle plate 22, the probe card 18 is fastened to the probe card cover 29. Therefore, if the operator loads the probe card 18 into the wafer inspection apparatus 10, the operator holds the probe card cover 29 and does not need to directly hold the probe card 18. Thus, it is possible to suppress the operator from contacting with the contact probes 20 of the probe card 18. Further, since the height of each support 24 protruding from the base 23 of the middle plate 22 is equal to or higher than a length of each contact probe 20 protruding from the probe card 18, when the probe card 18 is supported by the supports 24, each contact probe 20 is not in contact with the base 23 of the middle plate 22. Therefore, it is possible to load the probe card 18 into the wafer inspection apparatus 10 without bending the contact probes 20.

In the probe card transferring method in accordance with the above-described present example embodiment, the transfer arm 31 that enters into the space 26 between the table 21 and the middle plate 22 separates the middle plate 22 that mounts the probe card 18 thereon from the table 21. Further, when the middle plate 22 is transferred from the table 21 to the tester 15, the transfer arm 31 is contracted to move the middle plate 22 to the transfer robot 17. Therefore, when the probe card 18 is transferred from the table 21 to the tester 15, each contact probe 20 is not brought into contact with the base 23 of the middle plate 22. Thus, it is possible to suppress each contact probe 20 from being bent.

Further, in the probe card transferring method in accordance with the above-described present example embodiment, when the middle plate 22 is transferred from the table 21 to the tester 15, the middle plate 22 is held on the transfer arm 31. Therefore, it is possible to suppress the middle plate 22 from being deviated from the transfer arm 31.

Furthermore, in the probe card transferring method in accordance with the above-described present example embodiment, since the locating pins 27 protruding from the base 23 of the middle plate 22 toward the probe card 18 to be mounted can regulate a position of the probe card 18, when the middle plate 22 is transferred from the table 21 to the tester 15, it is possible to suppress the probe card 18 from being highly deviated from the middle plate 22.

Moreover, the wafer inspection apparatus 10 as a substrate inspection apparatus in accordance with the above-described present example embodiment includes the multiple tables 21. Therefore, the probe cards 18 may be temporarily stored in some of the tables 21. As a result, it is not necessary to coincide a timing of the introduction of the probe card 18 into the wafer inspection apparatus 10 by the operator with a timing of the transfer of the probe card 18 by the transfer robot 17.

The present disclosure has been explained with reference to the above-described example embodiment, but is not limited thereto.

Figure 11:
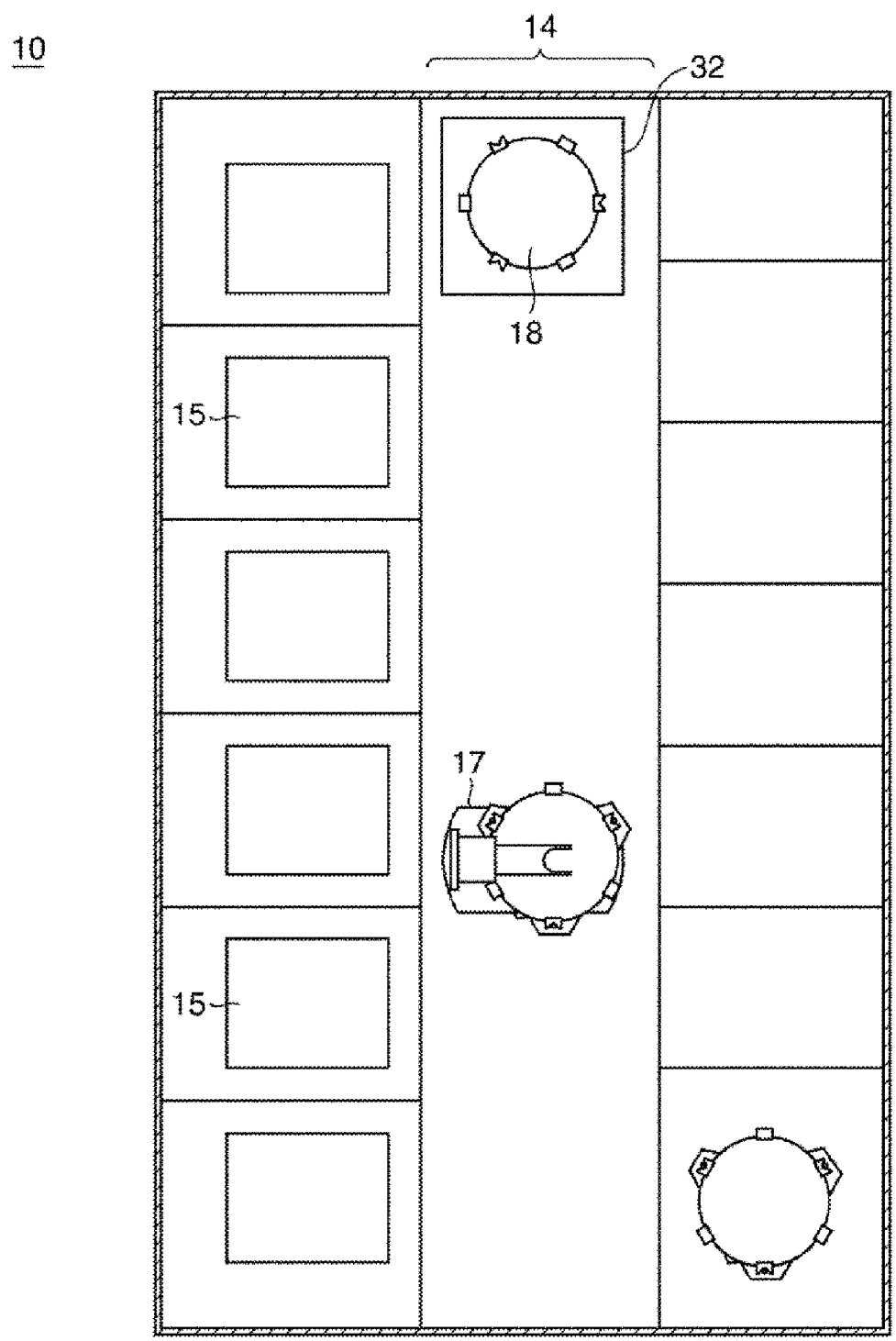
FIG. 11 is a horizontal cross-sectional view schematically illustrating a configuration of a modification example of the wafer inspection apparatus to which the probe card transferring method in accordance with the example embodiment is applied.

By way of example, as depicted in FIG. 11, a stocker 32 (accommodation unit) configured to accommodate multiple probe cards 18 may be arranged at a position where the transfer robot 17 can reach in the transfer section 14. In this case, even if the probe card 18 is not loaded from the outside into the wafer inspection apparatus 10, the probe card 18 on the tester 15 can be replaced with a probe card 18 accommodated in the stocker 32, and, thus, the probe card 18 can be freely transferred to the tester 15.

Further, in the above-described example embodiment, the transfer robot 17 adjusts a position of the probe card 18 with respect to the tester 15. However, an aligner 33 configured to mount the middle plate 22 in a space under each tester 15 and accurately move the mounted middle plate 22 in a horizontal direction or in a vertical direction may be provided to adjust the position of the probe card 18 (middle plate 22) with respect to the tester 15.

Figure 12A:
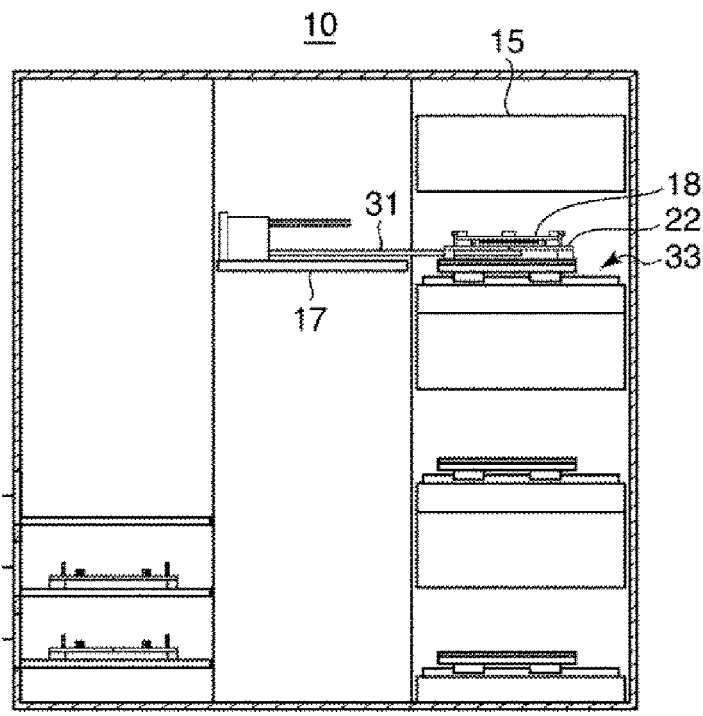
FIG. 12A and FIG. 12B are process diagrams provided to explain a modification example of the probe card transferring method in accordance with the example embodiment.

In this case, the transfer robot 17 arranges the probe card 18 to face the space under the tester 15, and then, the transfer arm 31 is extended to deliver the probe card 18 of each middle plate 22 to the aligner 33 (FIG. 12A).

Figure 12B:
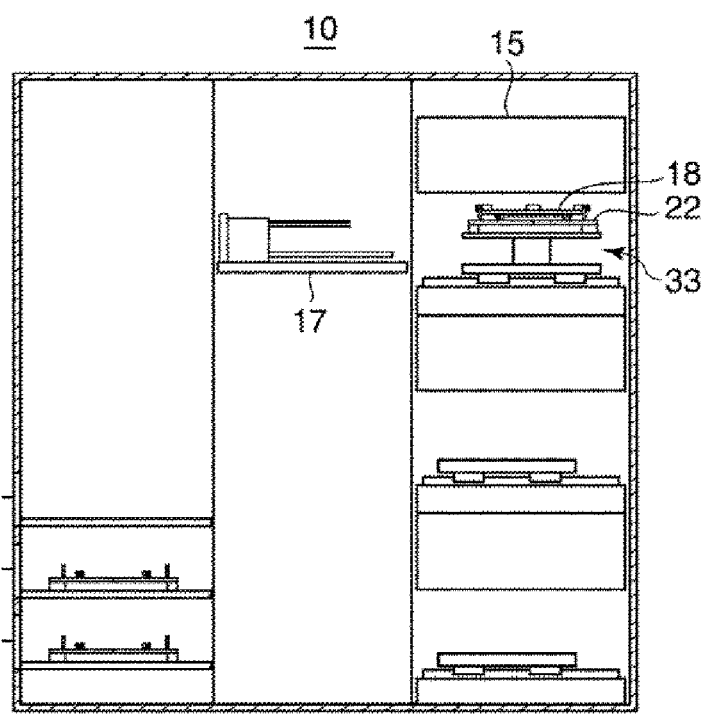

Then, the wafer inspection apparatus 10 checks a position of the probe card 18 mounted on the aligner 33 with a camera (not illustrated), and then, a suction opening (not illustrated) of the aligner 33 applies a negative pressure to the vacuum lines 28, and, thus, the probe card 18 is held on the middle plate 22 and the aligner 33. Then, the aligner 33 is moved to arrange the probe card 18 mounted on the middle plate 22 to face the tester 15 and adjusts a position of the probe card 18 with respect to the tester 15. Then, the aligner 33 is moved upwards to fasten the probe card 18 to the tester 15 (FIG. 12B).

Further, a storage medium storing a program code of software that implements a function of the above-described example embodiment may be supplied into a computer (for example, a controller 17d) included in the wafer inspection apparatus 10 and a CPU of the computer may read and execute the program code stored in the storage medium in order to achieve the object of the present disclosure.

In this case, the program code read from the storage medium implements the function of the above-described example embodiment, and the program code and the storage medium storing the program code constitute the present disclosure.

Further, the storage medium for supplying the program code may include any medium that can store the program code, for example, a RAM, a NV-RAM, a floppy (registered trademark) disk, a hard disk, a magneto-optical disk, an optical disk such as a CD-ROM, a CD-R, a CD-RW, a DVD (a DVD-ROM, a DVD-RAM, a DVD-RW, a DVD+RW), a magnetic tape, a nonvolatile memory card, and other ROMs. Alternatively, the program code may be supplied into the computer by downloading it from database or another non-illustrated computer connected to the Internet, a commercial network, or a local area network.

Furthermore, the function of the above-described example embodiment can be implemented by executing the program code read by the computer, and an OS (operating system) operated on the CPU may perform a part or all of the actual process in response to instructions of the program code and the function of the above-described example embodiment may be implemented by the process.

Moreover, the program code read from the storage medium may be written in a memory of a function extension board inserted into the computer or a function extension unit connected to the computer, and a CPU of the function extension board or the function extension unit may perform a part or all of the actual process in response to instructions of the program code, and the function of the above-described example embodiment may be implemented by the process.

The program code may include an object code, a program code executable by an interpreter, script data supplied to an OS, or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

I claim:

1. A substrate inspection apparatus comprising:
    a transfer mounting table configured to mount a probe card where multiple contact probes are provided on at least one surface thereof;
    at least one table in which the transfer mounting table is provided;
    a tester to which the probe card is mounted;
    a transfer device configured to transfer the transfer mounting table; and
    at least one engagement plate configured to determine a relative position of the probe card with respect to the transfer mounting table,
    wherein the transfer mounting table includes a base member and a supporting member protruding from the base member toward the probe card to be mounted, the supporting member being connected with the base member and being in direct contact with a bottom surface of the probe card, and a protruding height of the supporting member is equal to or higher than a protruding length of the contact probe from the probe card,
    the probe card is fastened to a holding device when the probe card is mounted on the transfer mounting table, and
    the transfer device transfers the transfer mounting table that mounts the probe card thereon from the at least one table to the tester.

2. The substrate inspection apparatus of claim 1,
    wherein the transfer device includes an arm configured to enter into a space between the at least one table and the transfer mounting table,
    the arm separates the transfer mounting table that mounts the probe card thereon from the at least one table, and
    when the transfer mounting table is transferred from the at least one table to the tester, the arm is contracted to deliver the transfer mounting table to the transfer device.

3. The substrate inspection apparatus of claim 2,
    wherein when the transfer mounting table is transferred from the at least one table to the tester, the transfer mounting table is held on the arm.

4. The substrate inspection apparatus of claim 1,
    wherein the transfer mounting table further includes a pin protruding from the base member toward the probe card to be mounted, and
    the pin is configured to regulate a position of the probe card.

5. The substrate inspection apparatus of claim 1,
    wherein the at least one table is plural in number.

6. The substrate inspection apparatus of claim 1, further comprising:
    an accommodation unit that is disposed at a position where the transfer device reaches when the transfer mounting table is transferred from the at least one table to the tester, and configured to accommodate the probe card.

7. A probe card transferring method performed in a substrate inspection apparatus including a transfer mounting table that mounts a probe card where multiple contact probes are provided on at least one surface thereof; a table in which the transfer mounting table is provided; a tester to which the probe card is mounted; a transfer device that transfers the transfer mounting table; and at least one engagement plate configured to determine a relative position of the probe card with respect to the transfer mounting table,
- wherein the transfer mounting table includes a base member and a supporting member protruding from the base member toward the probe card to be mounted, the supporting member being connected with the base member and being in direct contact with a bottom surface of the probe card, and a protruding height of the supporting member is equal to or higher than a protruding length of the contact probe from the probe card,
- the probe card is fastened to a holding device when the probe card is mounted on the transfer mounting table, and
- the transfer device transfers the transfer mounting table that mounts the probe card thereon from the table to the tester.

8. The probe card transferring method of claim 7,
- wherein the transfer device includes an arm configured to enter into a space between the table and the transfer mounting table, and the arm separates the transfer mounting table that mounts the probe card thereon from the table, and
- when the transfer mounting table is transferred from the table to the tester, the arm is contracted to deliver the transfer mounting table to the transfer device.

9. The probe card transferring method of claim 8,
- wherein when the transfer mounting table is transferred from the table to the tester, the transfer mounting table is held on the arm.

10. The probe card transferring method of claim 7,
- wherein the transfer mounting table further includes a pin protruding from the base member toward the probe card to be mounted, and
- the pin is configured to regulate a position of the probe card.

* * * * *